United States Patent [19]

Rogers

[11] Patent Number: 4,939,446
[45] Date of Patent: Jul. 3, 1990

[54] VOLTAGE TRANSMISSION LINK FOR TESTING EMI SUSCEPTIBILITY OF A DEVICE OR CIRCUITS

[76] Inventor: Wesley A. Rogers, 707 Balfour, Grosse Pointe Park, Mich. 48236

[21] Appl. No.: 175,168

[22] Filed: Mar. 30, 1988

[51] Int. Cl.$^5$ .............................................. G01R 31/02
[52] U.S. Cl. ..................................... 324/72; 324/627; 324/158 F; 338/214
[58] Field of Search .................. 324/95, 96, 102, 58 R, 324/58 A, 57 R, 72, 72.5, 538, 539, 158 F; 338/214

[56] References Cited

U.S. PATENT DOCUMENTS

| | | | |
|---|---|---|---|
| 3,743,925 | 7/1973 | Bossi | 324/58 A X |
| 3,991,397 | 11/1976 | King | 338/214 |
| 4,328,461 | 5/1982 | Butters et al. | 324/72 |
| 4,425,542 | 1/1984 | Tsaliovich et al. | 324/58 R |
| 4,510,468 | 4/1985 | Mayer | 338/214 X |
| 4,647,844 | 3/1987 | Biegon et al. | 324/58 R X |
| 4,704,596 | 11/1987 | Coffey et al. | 338/214 |
| 4,737,708 | 4/1988 | Ari et al. | 324/58 R X |

OTHER PUBLICATIONS

Knowles et al., "Cable Shielding Effectiveness Testing", IEEE Transactions on Electromagnetic Compatibility, vol. EMC-16, No. 1, pp. 16–23, 1974.

*Primary Examiner*—Reinhard J. Eisenzopf
*Assistant Examiner*—Robert W. Mueller
*Attorney, Agent, or Firm*—Davis, Hoxie, Faithfull & Hapgood

[57] ABSTRACT

The performance of a device under test is observed with and without the presence of controlled EMI fields. Voltage signals from the device under test are transmitted to an oscilloscope by overdamped conductors, a hybrid electrical/optical transmitter, a fiber optic cable, a receiver and a conductor cable. The overdamped conductors are transparent to the EMI fields and the current in those conductors is kept very small by the use of a very high input impedance in the transmitter. The hybrid transmitter may be an analog or a digital transmitter.

18 Claims, 2 Drawing Sheets 4,939,446

VOLTAGE TRANSMISSION LINK FOR TESTING EMI SUSCEPTIBILITY OF A DEVICE OR CIRCUITS

TECHNICAL FIELD OF THE INVENTION

This invention relates to method and apparatus for testing the susceptibility of devices, such as circuitry, to electromagnetic interference (EMI).

BACKGROUND OF INVENTION

Analog and digital electronic circuitry and attendant wiring may encounter serious operating difficulty in the presence of strong electromagnetic fields. Such fields are generally referred to as Electromagnetic Interference (EMI) fields. The circuits and attendant wiring may be shielded and filtered to provide some immunity to large EMI fields, however, it is not possible or practical to design the circuitry and attendant wiring so as to ensure immunity to EMI fields. Methods and apparatus, therefore, are required to test the susceptibility of the circuits and attendant wiring to EMI fields.

EMI testing is typically performed in shielded enclosures, known as "screen rooms", which provide an electromagnetic environment wherein only controlled EMI fields are present. Apparatus typically used inside the screen room includes current probes attached to a harness wire and a transmitter which sends the signals detected by the probes to a receiver outside the screen room, where the effects of the EMI fields on the circuit are determined.

To ensure the integrity of the screen room and the results of the EMI tests, any voltage measuring apparatus within the screen room should minimally perturb the controlled EMI fields and should be energized by a signal from the device under test only. For example, any test apparatus which might reradiate EMI fields impinging on the device under test or might otherwise inject any noise into the device under test must be avoided.

Probes suitable for monitoring current during EMI tests are commercially available. The Ailtech model number 91197-11 is one such device. Voltage probes are available, however, none are adequate to monitor voltages during EMI radiated susceptibility testing. Existing wire probes act as an antenna in the screen room, picking up energy from the controlled EMI fields. The induced energy on the probes may be injected into the device under test at the point of monitoring, where it can degrade performance. Existing wire probes, therefore, may cause an erroneous indication of susceptibility to EMI fields.

The lack of suitable wire voltage probes for use in EMI testing has resulted in the promulgation of test procedures, in certain industries, specifying that wired instrumentation, such as voltage probes, not be used.

OBJECTS AND SUMMARY OF THE INVENTION

It is an object of the present invention to provide a voltage probe and transmitter for monitoring the effect of EMI on a device under test.

It is a further object of the present invention to provide a voltage probe which does not affect the device under test, or the test results, in the presence of EMI fields.

It is a further object of the present invention to provide an electromagnetically transparent voltage probe.

It is a further object of the present invention to provide a method for measuring the effect of EMI fields on a device under test, without effecting the device under test or the test results.

In accordance with this invention an electromagnetically transparent voltage probe comprises electrically overdamped input conductors and a hybrid electrical/optical data transmitter having a high impedance input port connected to one end of the input conductors. The other end of the input conductors is connected to a device under test by short conducting clips. The clips' insulation is surface coated, with any bright, metallic, reflecting material such as a silver paint or foil to shield the clip contact from impinging EMI fields, thereby preventing the injection of signals into the device under test by the clip. The transmitter has an optical output port that is connected to a receiver by way of an EMI immune optical fiber, where the effects of controlled EMI fields on the device under test are monitored.

The input conductors may comprise a thread core impregnated with fine conducting particles and an insulating sheath. The overdamped conductors have a high distributed resistance so that they will not ring or tune at the frequencies of interest and, therefore, will not pick up energy from the EMI fields. As a result, the voltage probe transmission link may be used to monitor voltages of a device under test in the presence of a strong EMI field.

THE DRAWINGS

DETAILED DESCRIPTION

Figure 1:
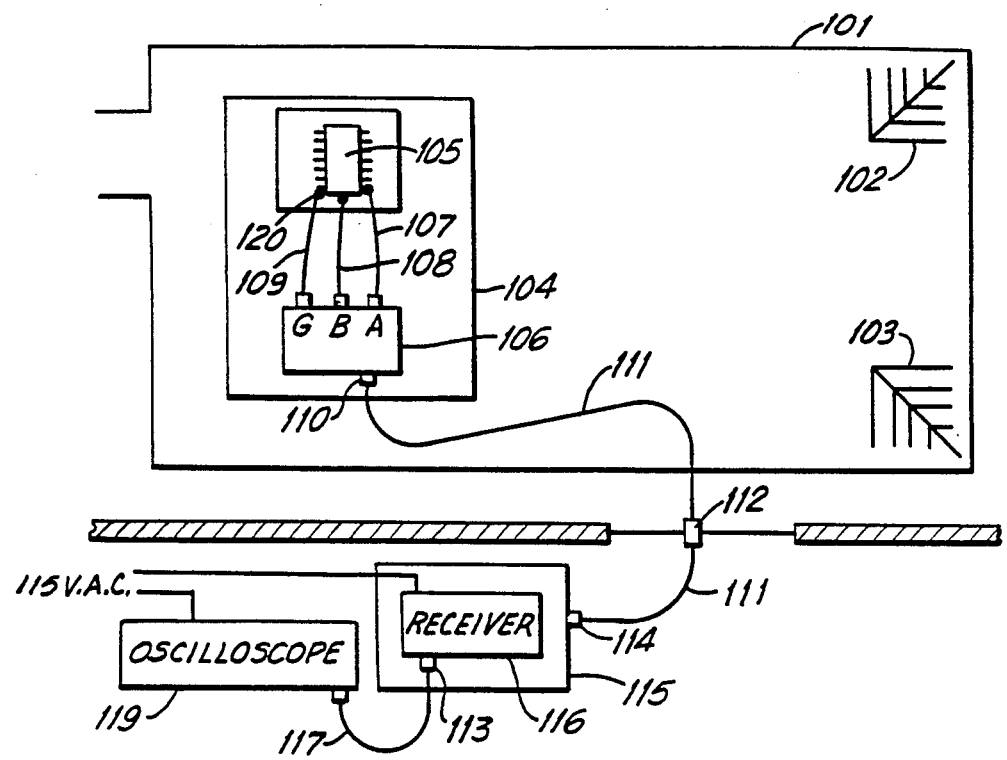
FIG. 1 is an illustration of the voltage probe, in accordance with the present invention, as used in a screen room in conjunction with a transmitter and receiver.

The application of a voltage transmission link in the EMI testing of electronic devices in a screen room 101, in accordance with the invention, is illustrated in FIG. 1 of the drawings. The device under test (DUT) 105 may be a component with attendant wiring resting on a test table 104 or may be a product, e.g., electronic circuit boards with attendant wiring harness and cables, which is installed in a large structure, such as an automobile. The DUT 105, is inside an EMI screen room 101 which provides a controlled electromagnetic environment, in which the antennae 102 and 103 generate EMI fields of known characteristics. While the screen room provides a convenient test environment, it is also possible to perform EMI testing in accordance with the invention without the benefit of a screen room.

The sources for driving the antennae 102 and 103 are not shown in the drawing and are usually located outside the screen room 101. There are controls for selectively turning the sources on and off and for setting the level of power and the frequencies of the signals applied to the antennae 102 and 103.

The transmitter 106 and the connectors 107, 108 and 109 provide the capability to monitor points of interest in a DUT 105 having either differential or single ended outputs. If the output is a differential signal, the conductors 107 and 108 are connected to the signal points of interest and the conductor 109 is connected to ground in the DUT 105. If the output is single ended, the conductor 107 is connected to that point of interest and the conductor 109 is connected to ground in the DUT 105, while the conductor 108 is not connected.

The connection to the points of interest in the DUT 105 is made by short conductive clips 120. Typically, the clips should have a length less than or equal to one centimeter to prevent the EMI electric field from coupling onto the clip and subsequent injection of energy into DUT 105. A one centimeter long clip will half-wavelength tune to 15 Ghz. This is effectively outside the uppermost frequency of interest—12.4 GHz. To allow the convenience of operation with longer clips and to extend the frequency range of operation to higher frequencies, the clips' insulation is coated with a conductive paint or foil, open at both ends, that effectively shields the clip from EMI. The coating also prevents the clip from reradiating EMI that has coupled onto the DUT 105. One such clip is a product number KLEPS3STO.64 marketed by Hirshmann Inc. of America. The conductors 107, 108 and 109 are connected to the input ports, A, B and G, respectively, of the transmitter 106 by BNC connectors, such as those marketed by Amphenol under product number 31-102.

The conductors 107, 108 and 109, in accordance with the invention, are of construction that renders them transparent to impinging electromagnetic fields, so that they do not pick up any energy from electromagnetic fields. They may comprise a continuous monofilament core of plastic which is impregnated with fine conductive particles, such as carbon and covered with a plastic insulating sheath. A conductor material with the above described characteristics is marketed by The Polymer Corporation of Reading, Pa. under the tradename FLUOROSINT® 719. It comprises a carbon/fluoropolymer core 0.030 inches in diameter enclosed by a transparent nylon insulating cover with an outer diameter of 0.040 inches and has resistance per length of cable within the range of 20,000 to 30,000 ohms per foot.

These conductors, therefore, have a uniformly distributed resistance, capacitance and inductance which causes them to be electrically overdamped and transparent to EMI fields. The conductors do not ring or tune at frequencies of interest in EMI testing and, therefore, will not pick up RF energy from EMI fields.

Figure 2:
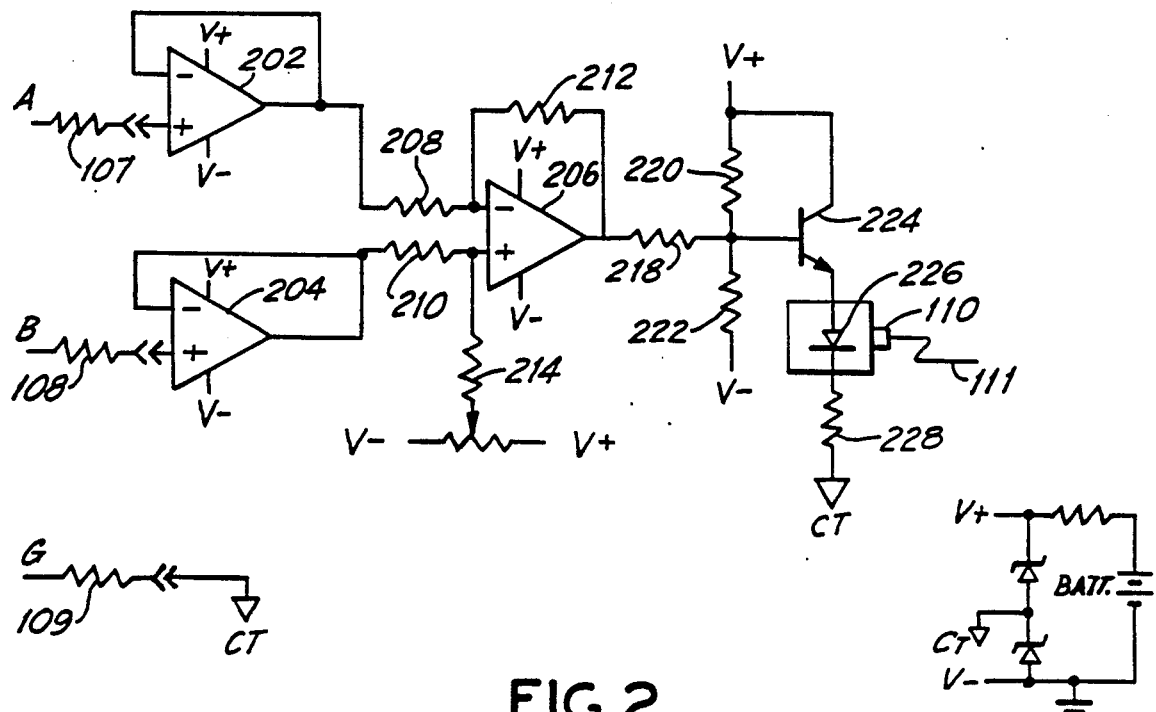
FIG. 2 is a schematic representation of a hybrid electrical/optical analog transmitter in accordance with a first embodiment of the present invention.
Figure 3:
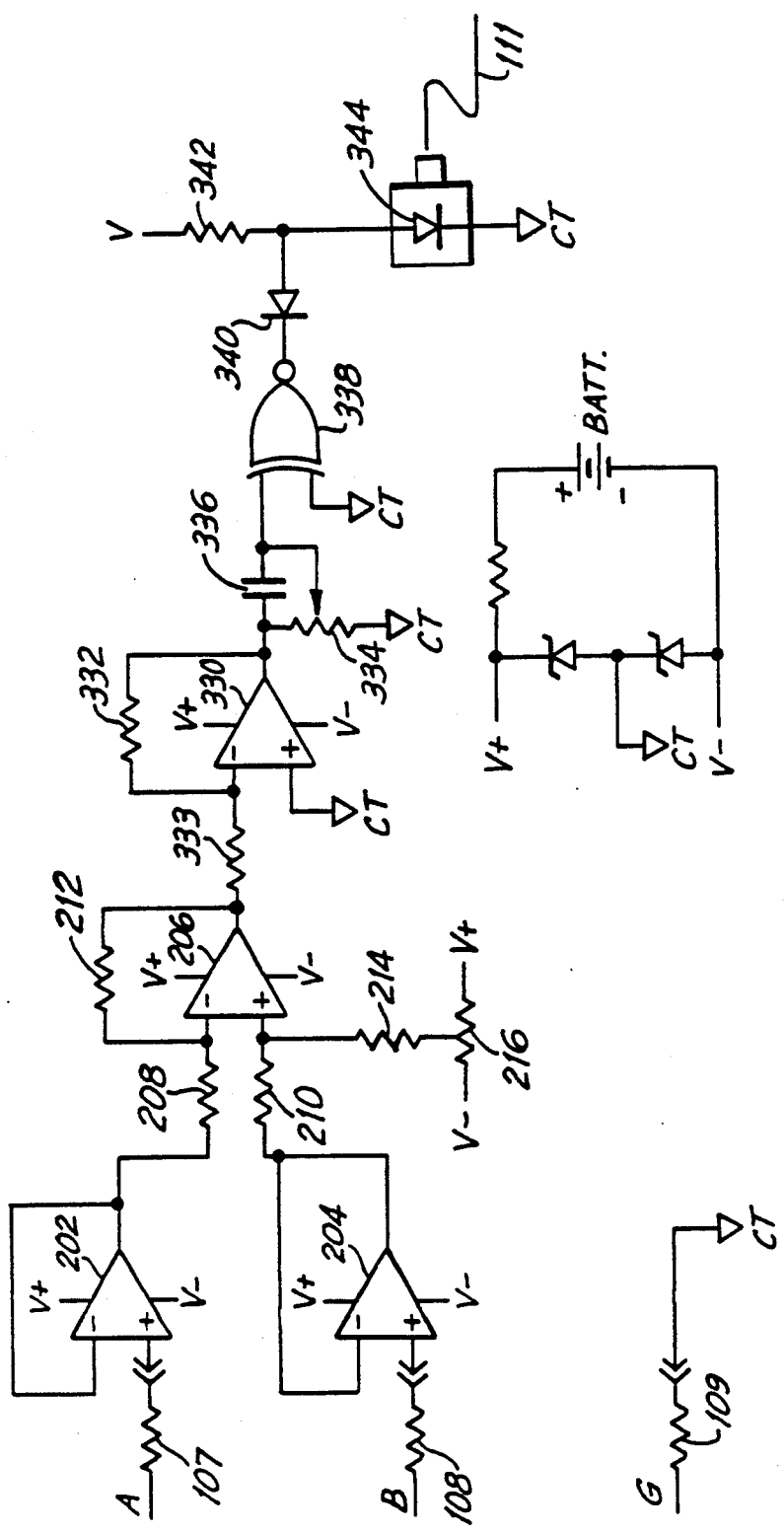
FIG. 3 is a schematic representation of a hybrid electrical/optical differential digital transmitter in accordance with a second embodiment of the present invention.

Referring to FIGS. 2 and 3 of the drawings, analog and digital embodiments of the data transmitter 106 are illustrated. In describing both embodiments, the A and B input ports comprise a FET input operational amplifier 202 and 204, such as Motorola's product number LF357BJ. The conductors 107 and 108 are connected through a BNC connector to the non-inverting terminal of the respective operational amplifiers 202 and 204. Each operational amplifier is configured in the voltage follower mode, with the output fed back to the inverting terminal, so that the input impedance is multiplied by the open loop gain of the operational amplifier. A very high input impedance is thus obtained, thereby limiting current in the conductors 107 and 108 to less than five nanoamperes.

The output of the operational amplifier 202 goes to the inverting terminal of differential amplifier 206 through a series resistor 208. The output of the operational amplifier 204 goes to the non-inverting terminal of the differential amplifier 206 through a series resistor 210. The differential amplifier 206 provides common mode rejection for differential signals. The common mode signal will move in phase at the non-inverting inputs at operational amplifiers 202 and 204. Since these signals have equal paths to the inputs of the differential amplifier 206, they will be in phase there as well. Since the differential amplifier 206 only amplifies the difference in signals at its inputs, the common mode signals are rejected.

The resistor 214 and adjustable resistor 216 bias the output of the differential amplifier 206 for linear output voltage swings across the light emitting diode (LED) 226. Resistor 212 provides a feedback path for the output of the differential amplifier 206 to its inverting input. Amplifier 206 is connected for unity gain in order to avoid over driving the LED 226 with large (10Vpp) analog input signals.

Referring to FIG. 2 of the drawings, the remaining portion of the analog transmission circuit will be described. The output of the differential amplifier 206 is input to the base of transistor 224 through a series resistor 218. The resistors 218, 220 and 222 bias the transistor 224 for linear operation. The emitter of transistor 224 is connected to the anode of the LED 226. The cathode of the LED 226 is connected to ground in series with a current limiting resistor 228. The analog optical output of the LED 226 is applied to a fiber optic cable 111 by way of an optical port 110.

The LED 226 is activated when transistor 224 is driven by the output of the differential amplifier 206 in response to the presence of differential signals at input ports A and B. The analog transmission circuit of FIG. 2 is capable of transmitting non-square wave signals from DC to 1 MHz. For square waves, the accurate circuit response is up to 100 kHz. A center tapped battery operated power supply is employed as shown in FIG. 2.

Referring to FIG. 3 of the drawings, the input operational amplifiers 202 and 204 and the differential amplifier 206 for common mode rejection are the same as in the analog transmitter of FIG. 2. The remaining portion of the digital transmission circuit will now be described. The output of the differential amplifier 206 is connected to the inverting input of a wideband high gain amplifier 330 through series resistor 333. The non-inverting input of amplifier 330 is grounded and its output is fed back through resistor 332 to the inverting input. Amplifier 330 provides voltage gain to the differential signal.

The amplified signal is applied to a pulse restoration circuit which comprises a potentiometer 334, capacitor 336 and exclusive NOR gate 338. The voltage output of the amplifier 330 is a one volt signal that depends on the differential input signals and is offset by a three volt DC level. The potentiometer 334 is adjusted to reduce the offset to a level where the one volt signal will cross the input threshold of gate 338 to properly trigger the gate 338. The output of amplifier 206 is reduced to 1 volt at 20 MHz due to probe attenuation at frequencies above 1 MHz. The input to amplifier 330 is approximately 10 mV at 10 MHz. A high gain amplifier is therefore required for the digital path. As a result, the gate 338 is triggered to output a fast rise time four volt signal when there is a differential digital signal at the input ports A and B, so that the LED 344 will output the differential signal on the optical cable 111. The diode 340 is a high speed diode that improves the rise time of the output signal. The gate 338 is not triggered when there is a common mode input at ports A and B, so that current flows from resistor 342 through the forward biased diode 340, thereby shutting the LED 344 off.

The digital transmission circuit of FIG. 3 is capable of transmitting digital signals with data rates in the range of DC to 20 MHz. As mentioned above, the analog signal path of FIG. 1 may be used for square waves with frequencies less than 100 kHz. Both the analog and digital circuits generally transmit a linear reproduction of the original waveform, but this is not necessary, since EMI typically manifests itself in much higher frequencies which tend to modulate the waveforms. It is only necessary, therefore, to measure changes in the signals under test.

The transmission circuits of FIGS. 2 and 3 may also receive single ended signals from a DUT 105 and transmit them to the receiver 116. This is accomplished by connecting the B input of each transmitter to ground, so that the non-inverting input of the operational amplifiers 204 is grounded. A switch may be provided an the front panel of the transmitter 106 to switch between single ended and differential signals.

The circuits of the transmitter 106 should be packaged in an enclosure that shields against EMI fields as high as 300 volts per meter. Also, the transmitter is powered by an internal battery within the enclosure, thereby avoiding external power leads and the necessity of providing sufficient EMI filtering.

Referring back to FIG. 1 of the drawings, the optical port 110 of the transmitter 106 is coupled to the receiver 116 by the fiber optic cable 111. The connectors at the ports 110 and 114 are optical and the feed through device 112 passes the cable 111 from the screen room 101 without transfer of EMI fields to or from the screen room. The receiver 116 is connected to a recorder, e.g. an oscilloscope 119, by a shielded electrical cable 117. The receiver 116 may be any commercially available receiver capable of handling the bandwidth of the output signals from the transmitter 106. The receiver 116 and transmitter 106 should be housed in a shielded enclosure that provides EMI immunity to fields as large as 300 volts per meter.

A DUT 105 may be tested for susceptibility to EMI fields in a screen room 101, as illustrated in FIG. 1 of the drawings, as follows. Signals from the DUT 105 are transmitted to the oscilloscope 119 by the hybrid electrical/optical transmitter 106, the fiber optic cable 111, the receiver 116 and the electrical cable 117. These signals are first observed without energizing the antennae 102 and 103. The antennae are subsequently energized by signals of differing power and frequencies and the change in signal waveforms appearing at the oscilloscope are observed. Changes in the observed signals with and without the presence of EMI fields serve to identify areas in the DUT 105 that are susceptible.

While illustrative preferred embodiments of the invention have been disclosed herein, many departures from those embodiments may be made without departing from the spirit and scope of the claimed invention. For example, a single ended digital transmitter without common mode rejection may be employed since high frequency (greater than 20 KHz) common mode noise is damped out. Further although discrete component circuitry has been shown, integrated circuits may be employed. For example, the transmitters of FIGS. 2 And 3 could be fabricated with a low cost integrated circuit.

What is claimed is:

1. An electromagnetically transparent voltage transmission link for determining the susceptibility of a device under test to EMI over certain frequencies of interest, by monitoring voltages of said device, comprising:
   conduction means, having first and second ends, said conduction means being electrically overdamped along its length for said frequencies of interest, the first end of said conduction means adapted to be connected to said device under test and exposed to said EMI, and
   a transmission device having very high impedance input port to which the second end of said conduction means is connected, for receiving at least one first signal from said device under test by way of said conduction means and for transmitting at least one second signal, related to said first signal, to a location remote from said device under test.

2. An electromagnetically transparent voltage probe in accordance with claim 1 wherein said conduction means comprises at least two overdamped conductors.

3. An electromagnetically transparent voltage probe in accordance with claim 1 wherein said conduction means comprises a thread core impregnated with fine conducting particles and an insulating layer surrounding said thread core.

4. An electromagnetically transparent voltage probe in accordance with claim 3 wherein said thread core is a monofilament plastic thread.

5. An electromagnetically transparent voltage probe in accordance with claim 3 wherein said fine conducting particles are composed of carbon.

6. An electromagnetically transparent voltage probe in accordance with claim 1 wherein said conduction means has a series resistance which is distributed along its length.

7. An electromagnetically transparent voltage probe in accordance with claim 6 wherein said conduction means exhibits a series resistance of several thousand ohms per foot thereof.

8. The electromagnetically transparent voltage probe of claim 1 wherein said conduction means has a capacitance and inductance which is distributed along its length.

9. An electromagnetically transparent voltage probe in accordance with claim 1 wherein said first end of said conduction means comprises a short conductive clip.

10. An electromagnetically transparent voltage probe in accordance with claim 9 wherein said short conductive clip is less than or equal to one centimeter in length.

11. An electromagnetically transparent probe in accordance with claim 10, wherein said short conductive clip is protected from impinging electric fields with electrically isolated silver paint or metal foil on the surface of the housing.

12. An electromagnetically transparent voltage probe in accordance with claim 1 wherein said second end of said conductor means comprises a BNC connector.

13. The electromagnetically transparent voltage probe of claim 1 wherein the high impedance port comprises a FET input operational amplifier.

14. The electromagnetically transparent voltage probe of claim 1 wherein said very high input impedance port comprises the non-inverting input of a FET input operational amplifier, the output of which is reapplied to its inverting input, to provide an input impedance on the order of approximately ten gigohms ($10^{10}$ ohms).

15. The electromagnetically transparent voltage probe of claim 1 wherein said transmission device converts an electrical signal at its input port to a related optical signal for optical transmission to the remote location.

16. The electromagnetically transparent voltage probe of claim 15 wherein said conduction means has two signal leads and one ground lead, and said transmission device functions to reject common mode signals, and amplify differential signals on said signal leads, said amplified differential signals controlling the application of a driving voltage to an LED, to produce said related optical signal.

17. A method for testing the susceptibility of a device under test to EMI fields over certain frequencies of interest by monitoring voltages of said device, comprising:
    attaching the first ends of at least two conductors to at least two points of interest in a device under test, the conductors being electrically overdamped along their length for said frequencies of interest,
    attaching the other ends of said conductors to respective high impedance input ports on a transmission device,
    transmitting a signal related to the voltages at said points of interest to a location remote from said device under test,
    selectively applying controlled EMI fields to said device under test and to at least a portion of said conductors, and
    monitoring the effect of said EMI fields on said device under test at said remote location.

18. The method of claim 17 wherein the step of monitoring the effect of said EMI fields on said device under test further comprises the step of comparing said signal related to the voltages at said points of interest during the selective application of controlled EMI fields to said signal during the absence of said EMI fields.

* * * * *